United States Patent [19]

Potter et al.

[11] Patent Number: 5,426,263
[45] Date of Patent: Jun. 20, 1995

[54] ELECTRONIC ASSEMBLY HAVING A DOUBLE-SIDED LEADLESS COMPONENT

[75] Inventors: Scott G. Potter, Coconut Creek; Michael J. Watkins, Sunrise, both of Fla.

[73] Assignee: Motorola, Inc., Schaumburg, Ill.

[21] Appl. No.: 172,340

[22] Filed: Dec. 23, 1993

[51] Int. Cl.6 .............................................. H01L 23/02
[52] U.S. Cl. .................................... 174/52.4; 257/738; 257/780
[58] Field of Search ........................... 174/52.4, 52.2; 257/688, 693, 698, 730, 737, 738, 779, 780; 437/183; 361/768, 776, 784, 789, 790, 749

[56] References Cited

U.S. PATENT DOCUMENTS

| | | | |
|---|---|---|---|
| 4,682,207 | 7/1987 | Akasaki et al. | 174/52.4 X |
| 4,688,150 | 8/1987 | Peterson | 174/52.4 X |
| 5,166,773 | 11/1992 | Temple et al. | 257/678 |
| 5,166,866 | 11/1992 | Kim et al. | 361/403 |
| 5,219,794 | 6/1993 | Satoh | 437/209 |
| 5,241,133 | 8/1993 | Mullen, III et al. | 174/52.4 |
| 5,313,365 | 5/1994 | Pennisi et al. | 361/760 |
| 5,313,366 | 5/1994 | Gaudenzi et al. | 361/760 |
| 5,327,325 | 7/1994 | Nilewakner, Jr. | 361/760 |

*Primary Examiner*—Lea P. Picard
*Assistant Examiner*—Christopher Horgan
*Attorney, Agent, or Firm*—Dale W. Dorinski

[57] ABSTRACT

An electronic assembly has a double-sided leadless component (10) and one or more printed circuit boards (30, 32). The component has a plurality of electrical terminations or pads (18) on both opposing major surfaces. Each of the printed circuit boards has a printed circuit pattern that has a plurality of pads (34, 36) that correspond to the electrical terminations on both sides of the double-sided leadless component. The electrical terminals on one side of the component are attached to the pads on the first substrate and the electrical terminals on the other side of the leadless component are attached to the pads on the second substrate. The printed circuit boards are joined together to form a multilayered circuit board (44) so that the double-sided leadless component is buried or recessed inside. The component is attached to the pads of the printed circuit board using solder.

10 Claims, 2 Drawing Sheets

ELECTRONIC ASSEMBLY HAVING A DOUBLE-SIDED LEADLESS COMPONENT

TECHNICAL FIELD

This invention relates generally to electrical components and assemblies and more particularly to surface mounted integrated circuits.

BACKGROUND

Integrated circuits are used in a wide variety of electronic products. As these products become smaller, lighter and thinner, the need to incorporate high-density integrated circuit (IC) packages increases substantially; however, these high-density IC packages carry with them a penalty of difficulty in interconnecting to a printed circuit board. This problem arises because of the ever-increasing number of terminals or input/output (I/O) pads on an ever decreasing package size. These demands result in the spacings the I/Os decreasing to levels that are difficult if not impossible to routinely solder to the printed circuit board. The net result is that extremely expensive, highly complex placement and soldering equipment is necessary to solder these packages on a circuit board.

Because the tight spacing of the IC package leads requires that the spaces on the printed circuit board be correspondingly small, thereby, increasing the cost of the printed circuit board is increased substantially. The technology used to manufacture printed circuit boards has not kept pace with the technology used to design and manufacture the integrated circuit packages. Therefore, when using the latest state of the art packages, one must pay a penalty in either cost or size of the finished assembly.

It would be highly desirable if a small integrated circuit package could be created that would have a high number of I/Os, yet have a spacing or pitch large enough to accommodate the technology of printed circuit boards.

SUMMARY OF THE INVENTION

Briefly, according to the invention, there is provided an electronic assembly comprising a double-sided leadless component and one or more printed circuit boards. The component has a plurality of electrical terminations or pads on both of the opposing major surfaces of the component. Each of the substrates has a printed circuit pattern that has a plurality of pads that correspond to the electrical terminations on both sides of the double-sided leadless component. The electrical terminals on one side of the component are attached to the pads on the first substrate and the electrical terminals on the other side of the leadless component are attached to the pads on the second substrate.

In an alternate embodiment of the invention, the substrates are printed circuit boards and in still another case, the printed circuit boards are joined together to form a multilayer circuit board such that the double-sided leadless component is buried or recessed inside the multilayer printed circuit board. The component is attached to the pads of the printed circuit board using solder.

In another embodiment of the invention, one of the printed circuit boards is a flexible circuit, one end of which is attached to the top side of the double-sided leadless component. The other end of the flexible circuit is attached to the first printed circuit substrate.

DETAILED DESCRIPTION OF THE PREFERRED EMBODIMENT

Figure 1:
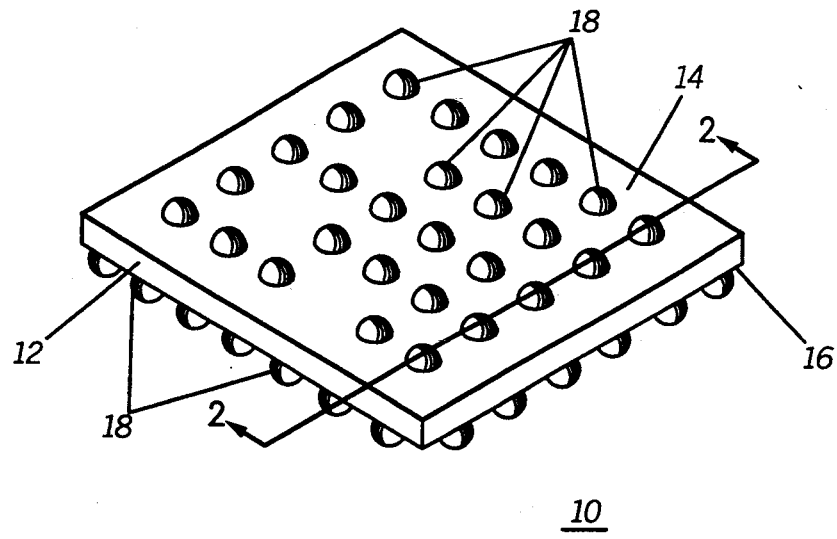
FIG. 1 is an isometric view of a double-sided leadless component in accordance with the present invention.
Figure 2A:
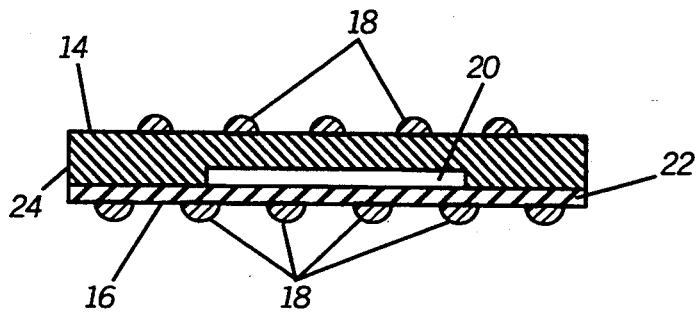
FIGS. 2A–2D is a view through 2—2 of FIG. 1 showing alternate embodiments of the present invention.
Figure 2B:
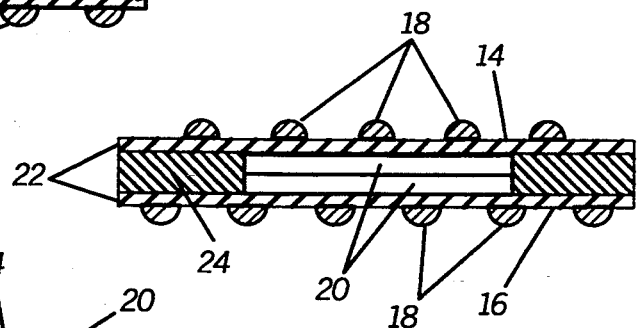
Figure 2C:
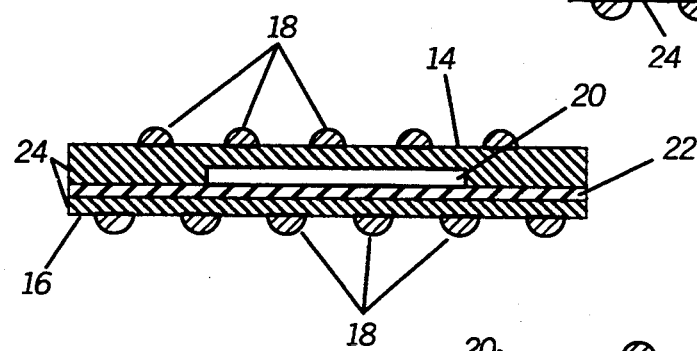
Figure 2D:
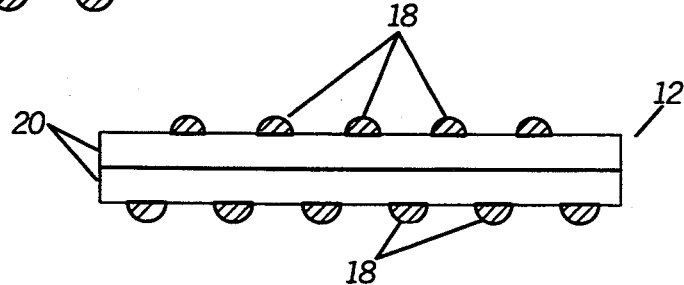

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a double-sided leadless component 10 is shown in perspective view. The component has a body 12 that forms an enclosure around an integrated circuit or other semiconductor device. Typically, the component 10 has a very high aspect ratio such that it has two opposing major surfaces forming a top 14 and a bottom 16. On each of the major surfaces 14, 16 lies a plurality of electrical terminations 18. These electrical terminals 18 are typically arranged in an array format but may also be laid out in an irregular fashion.

Referring now to FIGS. 2A–2D, some details of possible configurations of the double-sided leadless component 10 will be seen. Each of these configurations is a cross-section through section 2—2 of FIG. 1. An integrated circuit chip (IC) 20 may be mounted on a circuit carrying substrate 22. An enclosure 24 is formed around the IC 20 to cover or encapsulate it. The enclosure 24 may take several forms and simply encapsulate the IC and the top side of the substrate 22, or it may encapsulate the entire substrate 22. The electrical I/Os of the IC 20 are then fed to the package exterior in any number of ways to form electrical terminations 18 on the top 14 and bottom 16 of the package. The enclosure 24 can take many forms, but is typically a transfer-molded epoxy material such as that normally used in the manufacture of semiconductor devices. A package similar to that used in the instant invention is an overmolded pad array chip carrier described in more detail in U.S. Pat. No. 5,241,133 assigned to Motorola, Inc., and incorporated herein by reference.

By forming electrical terminations on both the top and bottom sides of the package, both surfaces are utilized, thereby allowing one to spread the I/Os or electrical terminations out over a larger area. Since we have essentially doubled the available surface or footprint area of the package without increasing the size of the package, it will be clear to one skilled in the art that a much higher density package can be obtained, while at the same time, relaxing the spacing requirements for the terminations. The invention also provides for a very simple double-sided leadless component to be made, wherein two ICs 20 are simply mounted back-to-back so that the electrical terminations 18 face in opposite directions. As shown in FIGS. 2A-2D, the electrical terminations are typically bumped with a solder bump.

Figure 3:
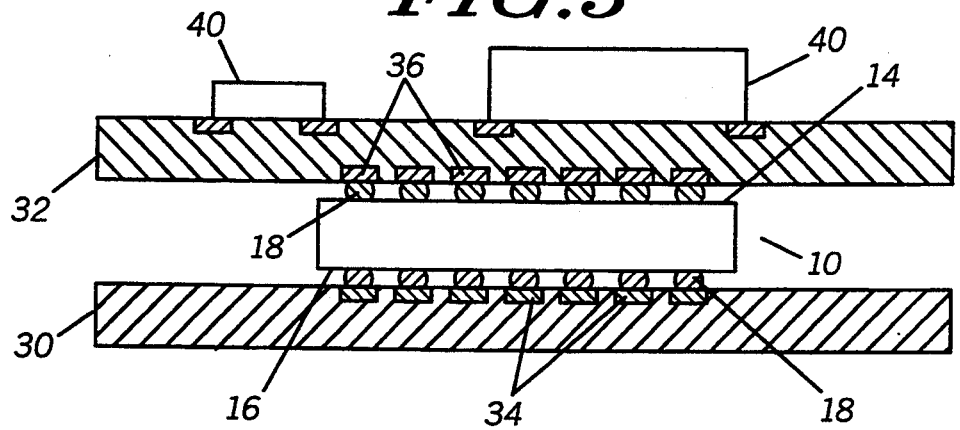
FIG. 3 is a cross-sectional view of an electronic assembly in accordance with the present invention.

Having now described the double-sided leadless integrated circuit package of the instant invention, its use in an electrode assembly to create an entire interconnected assembly will now be illustrated. Referring now to FIG. 3, the double-sided leadless component as described in FIGS. 1 and 2A-2D is attached to a first substrate 30 and a second substrate 32. The double-sided leadless component 10 can be any of the variations shown in FIGS. 2A-2D or even other variations. The electrical terminations 18 on a first major surface 16 of the component 10 (i.e. the bottom side of the component) are attached to a corresponding plurality of pads 34 on the first substrate 30. Since the double-sided leadless component 10 has been bumped with solder balls, the component is easily soldered to the pads on the substrate.

Figure 4:
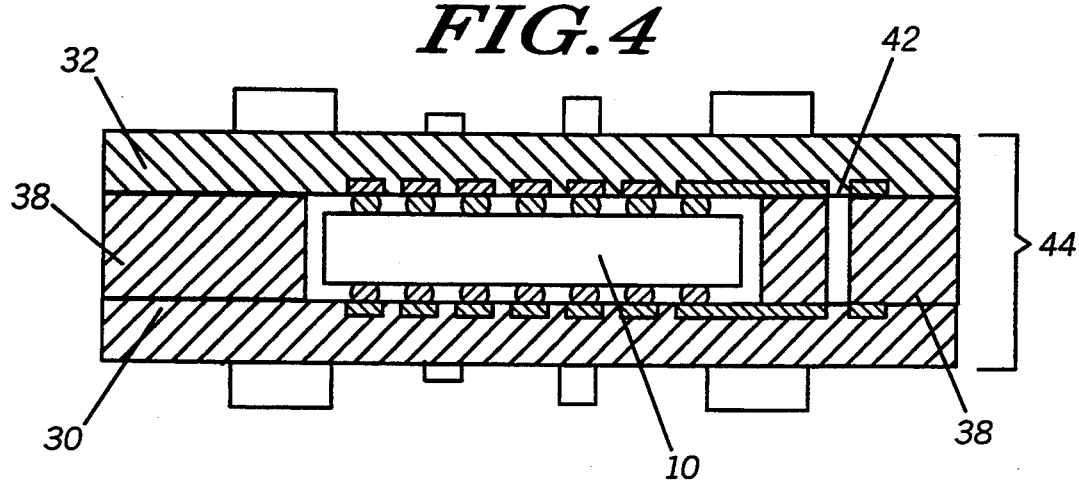
FIG. 4 is a cross-sectional view of an alternate embodiment of an electronic assembly in accordance with the present invention.

In a similar manner, the terminals 18 on the ether major surface 14 of the double-sided leadless component (i.e. the top) are likewise soldered to the pads 36 on the second substrate. This results in a "sandwich" where the double-sided leadless component 10 is captured between the first and second substrates 30. If desired, further components, such as resistors and capacitors 40, may be soldered in a conventional manner to the exterior or opposite side of either of the substrates 30 30 or 32. Referring now to FIG. 4, a scheme whereby the electrical terminations on opposite sides of the component 10 may be electrically interconnected is shown. First and second substrates 30 and 32 are joined together by one or more inner layers 38. These inner layers are typically materials known in the trade as prepregs and are, for example, B-staged epoxy laminates. A series of vias or plated-thru holes 42 can be formed in the inner layers 38 such that the electrical terminations on the first substrate 32 are electrically connected to some of the electrical terminations on the second substrate 30. The vias 42 are formed in a conventional manner and may be any of numerous types of vias, such as plated-thru holes, wires, pins, rivets, plugged holes, etc. In this case, one will realize that the double-sided leadless component 10 is now "buried" inside the printed circuit board formed by elements 30, 32 and 38. An alternative structure to that shown in FIG. 4 is disclosed in FIG. 5 where one end of the multilayered printed circuit board 44 is left open so that a portion of the component 10 is exposed. By forming a laminated structure that consists of the first substrate 30, an inner layer or filler 38, and the second substrate 32 a multilayered circuit board 44 is formed, similar to that known in the conventional art.

Figure 5:
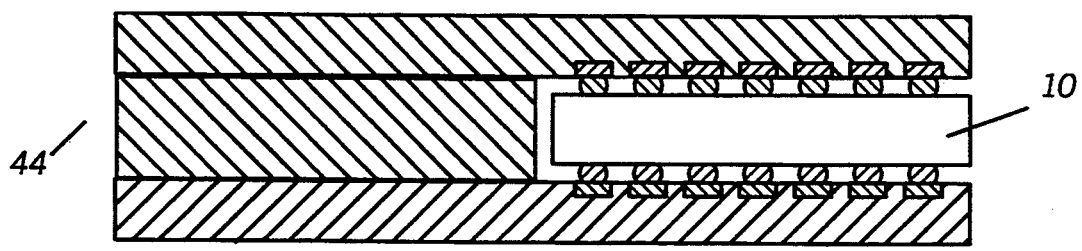
FIG. 5 is a cross-sectional view of still another embodiment of an electronic assembly in accordance with the present invention.
Figure 6:
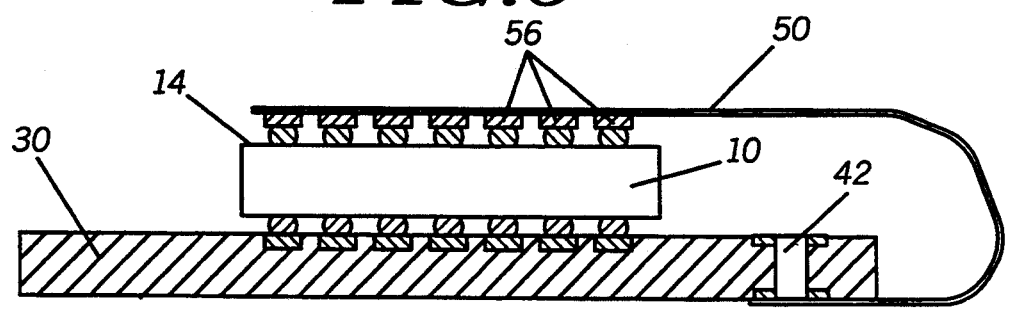
FIG. 6 is a cross-sectional view of yet another embodiment of an electronic assembly in accordance with the present invention.

FIG. 6 shows an alternative method of connecting the double-sided leadless component to a printed circuit substrate. In this case, the component 10 is connected to a first substrate 30 in a manner described above. The electrical terminations on the opposite side of the package (i.e. the top 14) are then connected to a flexible circuit substrate 50. The flexible surface substrate has an array or plurality of pads 56 that correspond to those pads on the top side 14 of the component 10. The other end of the flexible circuit is wrapped to connect to other pads or I/Os on the first substrate 30. The flexible circuit shown in FIG. 5 is connected to the bottom side of the first substrate 30, however, it should be obvious to those skilled in the art that it may be just as easily connected to the top side. Again, as in FIG. 4, plated-thru holes or vias 42 may be used in order to effect side-to-side interconnections and routing of the circuit traces on the first substrate 30. One may also find other circuitry or runners can be incorporated onto the flexible circuit 50 in order to interconnect the pads 56 to the vias or plated-thru holes 42.

By utilizing both the top surface and the bottom surface of the double-sided leadless component, a package that has a large number of I/Os in a very small space has been created that also has low density interconnections. This allows one to either reduce the size of the IC package or to increase the pitch or spacing between the interconnection pads. This invention provides for a package that can be mounted onto printed circuit boards having conventional spacings without the need for highly complicated and expensive placement equipment. A high-density electronic interconnection assembly is thereby created, obviating the drawbacks experienced in the prior art.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

We claim:

1. An electronic assembly, comprising:
   a double sided leadless component having two opposing major surfaces and a plurality of electrical terminals on both of the opposing major surfaces;
   first and second substrates, each having a circuit pattern comprising a plurality of pads corresponding to the terminals on the major surfaces of the double sided leadless component;
   the electrical terminals of one major surface of the component attached to the pads on the first substrate; and
   the electrical terminals of the other major surface of the component attached to the pads on the second substrate.

2. The electronic assembly as described in claim 1, wherein the double sided leadless component comprises two integrated circuits attached back to back.

3. The electronic assembly as described in claim 1, wherein the double sided leadless component comprises;
   a circuit carrying substrate;
   an integrated circuit chip mounted on the circuit carrying substrate;
   an enclosure covering the integrated circuit chip, thereby forming a package having two opposing major surfaces; and
   a plurality of electrical terminals on both of the opposing major surfaces, the terminals electrically interconnected to the integrated circuit chip.

4. The electronic assembly as described in claim 1, wherein the first and second substrates are printed circuit boards.

5. The electronic assembly as described in claim 4, wherein the first and second substrates are joined together to form a multilayer printed circuit board.

6. The electronic assembly as described in claim 5, wherein the component is buffed inside the multilayer printed circuit board.

7. The electronic assembly as described in claim 1, wherein the component is attached to the pads of the substrates with solder.

8. An electronic assembly, comprising:
- a double sided leadless component having two opposing major surfaces and a plurality of electrical terminals on both of the opposing major surfaces;
- a first substrate having a circuit pattern comprising a plurality of pads corresponding to the terminals on one major surface of the double sided leadless component, said terminals attached to the pads on the first substrate by means of solder; and
- a flexible circuit substrate having a circuit pattern comprising a plurality of pads corresponding to the terminals on the other major surface of the double sided leadless component, said terminals attached to the pads on the flexible circuit, and the flexible circuit attached to the first substrate.

9. The electronic assembly as described in claim 8, wherein the double sided leadless component comprises two integrated circuits attached back to back.

10. The electronic assembly as described in claim 8, wherein the double sided leadless component comprises;
- a circuit carrying substrate;
- an integrated circuit chip mounted on the circuit carrying substrate;
- an enclosure covering the integrated circuit chip, thereby forming a package having two opposing major surfaces; and
- a plurality of electrical terminals on both of the opposing major surfaces, the terminals electrically interconnected to the integrated circuit chip.

* * * * *

UNITED STATES PATENT AND TRADEMARK OFFICE
CERTIFICATE OF CORRECTION

PATENT NO. : 5,426,263
DATED : June 20, 1995
INVENTOR(S) : Potter, et al.

It is certified that error appears in the above-identified patent and that said Letters Patent is hereby corrected as shown below:

Column 4, line 67, delete "buffed" and insert therefor -- buried --.

Signed and Sealed this

Thirty-first Day of October 1995

Attest:

BRUCE LEHMAN

Attesting Officer     Commissioner of Patents and Trademarks